(12) United States Patent
Mochizuki et al.

(10) Patent No.: US 10,312,349 B2
(45) Date of Patent: Jun. 4, 2019

(54) REDUCING RESISTANCE OF BOTTOM SOURCE/DRAIN IN VERTICAL CHANNEL DEVICES

(71) Applicant: International Business Machines Corporation, Armonk, NY (US)

(72) Inventors: Shogo Mochizuki, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/980,789

(22) Filed: May 16, 2018

(65) Prior Publication Data

US 2018/0269310 A1    Sep. 20, 2018

Related U.S. Application Data

(62) Division of application No. 15/457,580, filed on Mar. 13, 2017, now Pat. No. 10,084,065.

(51) Int. Cl.
*H01L 29/66* (2006.01)
*H01L 21/8238* (2006.01)
*H01L 29/45* (2006.01)
*H01L 29/78* (2006.01)

(52) U.S. Cl.
CPC .......... *H01L 29/66666* (2013.01); *H01L 21/823814* (2013.01); *H01L 21/823871* (2013.01); *H01L 21/823885* (2013.01); *H01L 29/456* (2013.01); *H01L 29/6653* (2013.01); *H01L 29/66545* (2013.01); *H01L 29/785* (2013.01)

(58) Field of Classification Search
CPC .......... H01L 29/666666; H01L 29/456; H01L 29/6653; H01L 29/66545
See application file for complete search history.

(56) References Cited

U.S. PATENT DOCUMENTS

| | | | |
|---|---|---|---|
| 7,833,873 B2* | 11/2010 | Greene | H01L 29/458 257/E21.151 |
| 2016/0197074 A1* | 7/2016 | Lee | H01L 27/0924 257/369 |
| 2016/0233164 A1* | 8/2016 | Choi | H01L 27/0924 |
| 2016/0276449 A1* | 9/2016 | Bae | H01L 21/308 |
| 2016/0308016 A1* | 10/2016 | Choi | H01L 29/41791 |

OTHER PUBLICATIONS

List of IBM Patents or Applications Treated as Related, 2018.

* cited by examiner

*Primary Examiner* — Anthony Ho
(74) *Attorney, Agent, or Firm* — Garg Law Firm, PLLC; Grant Johnson

(57) ABSTRACT

During a fabrication of a semiconductor device, a recess is created in a substrate material disposed along a direction of a plane of fabrication. A layer of a removable material is formed in the recess. A bottom layer is formed above the layer of removable material. A vertical channel above the bottom layer is formed in a direction substantially orthogonal to the direction of the plane of fabrication. A gate is formed using a metal above the bottom layer and relative to the vertical channel. A tunnel is created under the bottom layer by removing the removable material from under the bottom layer such that the backside of the bottom layer forms a ceiling of the tunnel. The tunnel is filled using a conductive material such that the conductive material makes electrical contact with the backside of the bottom layer.

20 Claims, 13 Drawing Sheets

REDUCING RESISTANCE OF BOTTOM SOURCE/DRAIN IN VERTICAL CHANNEL DEVICES

TECHNICAL FIELD

The present invention relates generally to a method, system, and computer program product for reducing the resistance of a current path in vertical fin semiconductor devices. More particularly, the present invention relates to a method, system, and computer program product for reducing resistance of bottom source/drain in vertical channel devices.

BACKGROUND

An integrated circuit (IC) is an electronic circuit formed using a semiconductor material, such as Silicon, as a substrate and by adding impurities to form solid-state semiconductor electronic devices (device, devices), such as transistors, diodes, capacitors, and resistors. Any reference to a "device" herein refers to a solid-state semiconductor electronic device unless expressly distinguished where used. Commonly known as a "chip" or a "package," an integrated circuit is generally encased in hard plastic, forming a "package." The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

A device generally uses several layers of different materials to implement the device properties and function. A layer of material can be conductive, semi-conductive, insulating, resistive, capacitive, or have any number of other properties. Different layers of materials have to be formed using different methods, given the nature of the material, the shape, size or placement of the material, other materials adjacent to the material, and many other considerations.

The software tools used for designing ICs produce, manipulate, or otherwise work with the circuit layout and circuit components on very small scales. Some of the components that such a tool may manipulate may only measure a few nanometers across when formed in Silicon. The designs produced and manipulated using these software tools are complex, often including hundreds of thousands of such components interconnected to form an intended electronic circuitry.

A Field Effect Transistor (FET) is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin). A vertical channel device is a device in which the current travels from a source to a drain in a direction that is substantially orthogonal to the plane of fabrication, e.g., the plane of the substrate material. A finFET can be constructed as a vertical channel device whereby, a source or drain (S/D) is formed in or near the plane of fabrication, a fin is fabricated substantially perpendicular to the plane of fabrication, and another S/D is fabricated above the fin. A finFET with a vertical channel is referred to herein as a vertical finFET.

The S/D that is in or near the plane of fabrication is referred to herein as the bottom S/D. The other S/D is referred to as the top S/D. The side of the bottom S/D that is facing the substrate (and is opposite to the side connecting to the fin) is referred to herein as the backside of the device.

In a FET, a gate controls the current flow between the two S/D through the fin. The direction along the vertical length of the fin (perpendicular to the plane of fabrication) running from one S/D to the other S/D is referred to herein as a vertical running direction of the fin. The direction of the current flowing between the two S/D through the fin is therefore substantially perpendicular to the plane of fabrication.

A CB contact is an electrical connection to a gate. A circuit external to the finFET uses the CB contact to electrically connect a part of the circuit to a gate in the finFET.

A TS contact is an electrical contact that provides electrical connectivity to an S/D. A circuit external to the finFET uses the TS contact to electrically connect a part of the circuit to a S/D in a vertical finFET.

The illustrative embodiments recognize that the present methods and techniques for fabricating a vertical finFET suffer from several problems. For example, presently, the TS contact for the bottom S/D is connected to the same side or surface of the bottom S/D to which the fin is connected. This manner of placing the TS contact is necessitated by the fact that once formed, the backside of the bottom S/D not being accessible for TS contact placement.

The illustrative embodiments recognize that placing the TS contact on the same surface as the fin on the bottom S/D greatly increases the distance the electrical current has to travel through the bottom S/D. The current travels down the TS contact, down through the bottom S/D, across the distance from the location of the TS contact to the location of the fin, and up through the bottom S/D to enter the fin. This down-and-up path through the bottom S/D significantly increases the resistance faced by the electrical current in the bottom S/D.

The illustrative embodiments recognize that if the TS contact could be electrically connected to the backside of the bottom S/D, the electrical current would only have to travel from the TS contact up through the bottom S/D to enter the fin. Thus, the electrical path through the bottom S/D, and consequently the resistance of the bottom S/D would be significantly reduced. Therefore, the illustrative embodiments recognize that some manner of accessing the backside of the bottom S/D is desirable.

The illustrative embodiments further recognize that accessing the backside of the bottom S/D is further exacerbated by the gate fabrication process. Even though this is not how the vertical channel devices are presently fabricated, even if some connectivity were maintained with the backside of the bottom S/D during the fabrication process, the gate construction step would destroy or damage such connectivity. The illustrative embodiments recognize that gates use a metal, and the fabrication of the gate is a high temperature step that would be detrimental to any connecting apparatus that could be pre-fabricated at the backside of the bottom S/D.

Therefore, any connectivity to the backside of the bottom S/D should be fabricated after the gates have been fabricated. Therefore, a method for fabricating access to the backside of the bottom S/D after the gates have been fabricated would be desirable.

SUMMARY

The illustrative embodiments provide a method, system, and computer program product. An embodiment includes a method that creates, during a fabrication of a semiconductor device, in a substrate material disposed along a direction of a plane of fabrication, a recess. The embodiment forms, in the recess, a layer of a removable material. The embodiment forms, above the layer of removable material, a bottom layer, wherein a backside of the bottom layer is a side of the bottom layer that faces the layer of removable material. The embodiment forms, in a direction substantially orthogonal to the direction of the plane of fabrication, a vertical channel above the bottom layer. The embodiment forma, above the bottom layer and relative to the vertical channel, a gate using a metal. The embodiment creates a tunnel under the bottom layer by removing the removable material from under the bottom layer such that the backside of the bottom layer forms a ceiling of the tunnel. The embodiment fills the tunnel using a conductive material such that the conductive material makes electrical contact with the backside of the bottom layer. The embodiment electrically connects a contact with the conductive material filled in the tunnel to form an electrical connection with the backside of the bottom layer. Thus, the embodiment enables a reduction in a path of a current, thereby reducing the resistance of the bottom S/D of a vertical channel device.

Another embodiment further deposits, without obstructing the tunnel, a metal on inside surfaces of the tunnel, the depositing shrinking an opening of the tunnel but leaving the tunnel open end-to-end, and wherein the filling occurs after the depositing of the metal on the inside surfaces of the tunnel such that the conductive material being filled makes electrical contact with the deposited metal at least on the ceiling of the tunnel. Thus, the embodiment improves the ability to fill the tunnel with the conductive material.

In another embodiment, the conductive material is a silicide of a metal. Thus, the embodiment allows the tunnel to be filled with a presently known and used the conductive material.

In another embodiment, the creating the tunnel occurs after forming the gate, wherein the forming the gate employs a temperature that is destructive to a second contact when the second contact is placed on the bottom layer prior to the forming the gate. Thus, the embodiment prevents the destruction of the connectivity to the backside of the bottom S/D.

Another embodiment further forms a first shallow trench isolation (STI) structure on one side of the bottom layer and the layer of the removable material. The embodiment forms a second STI structure on an opposite side of the bottom layer and the layer of the removable material. The embodiment exposes a third side of the layer of removable material for the creating the tunnel. Thus, the embodiment enables the formation of the tunnel in a specific manner.

Another embodiment further forms a hard mask on top of the vertical channel. The embodiment forms at least one spacer layer. The embodiment forms at least one high resistance (high-k) layer. The embodiment forms at least one work function metal (WFM) layer. Thus, the embodiment enables forming a fin as a vertical channel device.

Another embodiment further forms above the vertical channel a top source/drain (S/D), wherein the bottom layer is a bottom S/D, and wherein an electrical current flows between the top S/D and the bottom S/D through the vertical channel in the direction substantially orthogonal to the direction of the plane of fabrication. Thus, the embodiment limits the current flow through the bottom S/D to a single vertical traversal through the bottom S/D before reaching from a contact to the vertical channel.

In an embodiment, the removable material is Silicon Germanium (SiGe). Thus, the embodiment allows a presently known material to be used as the removable material.

In another embodiment, the vertical channel device is a vertical fin Field Effect Transistor (vertical finFET). Thus, the embodiment enables the fabrication of a specific type of vertical channel semiconductor device.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
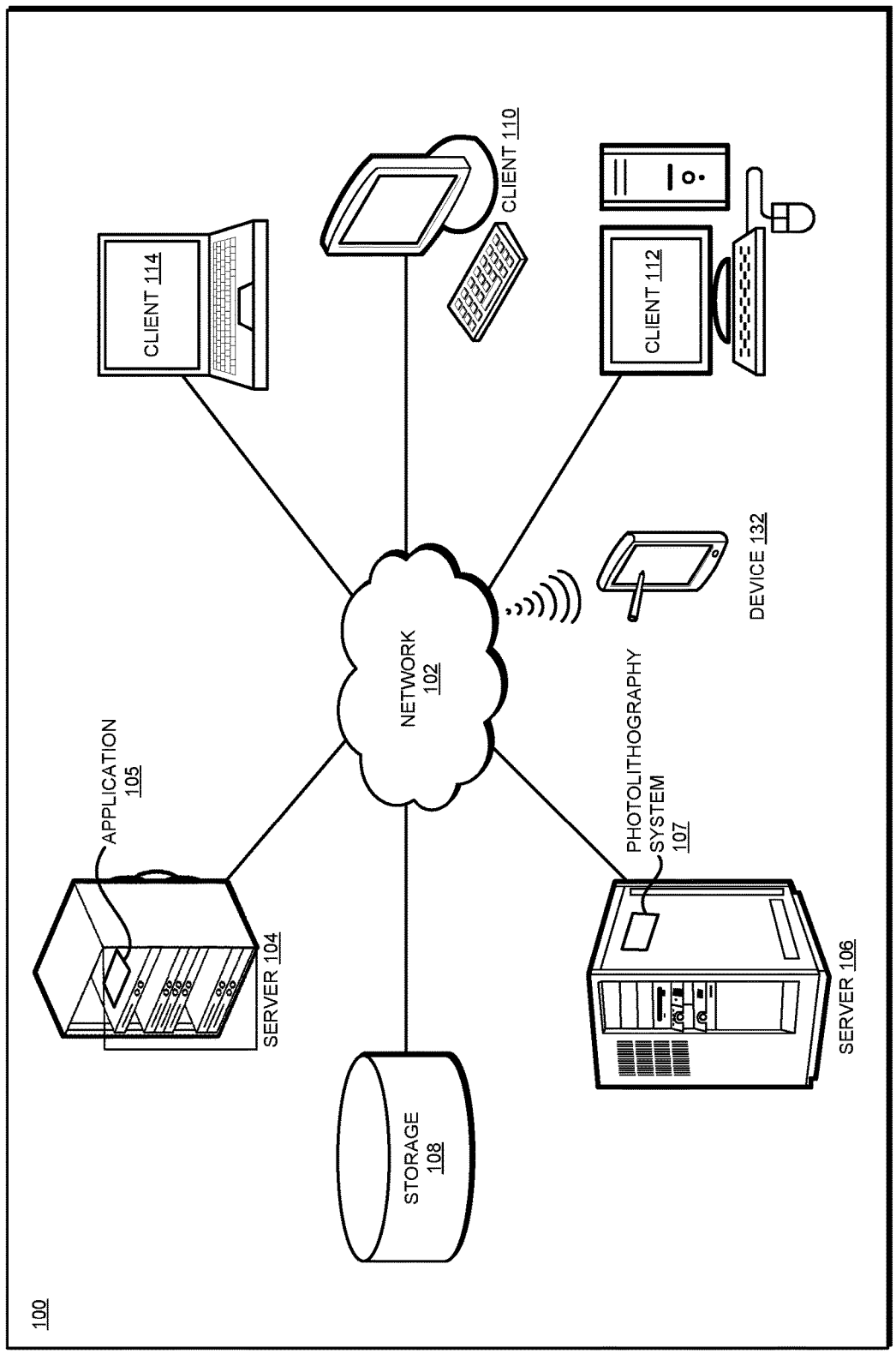
FIG. 1 depicts a block diagram of a network of data processing systems in which illustrative embodiments may be implemented.

The illustrative embodiments used to describe the invention generally address and solve the above-described problems and other problems related to resistance of a bottom S/D in a vertical channel finFET. The illustrative embodiments provide a fabrication method for finFET devices that reduces the resistance of the bottom S/D by creating a crating a hollow tunnel from a removable layer under the bottom S/D and filling the tunnel with a suitable conductive material, which is in electrical contact with the backside of the bottom S/D, and to which the TS contact can be electrically coupled.

An embodiment can be implemented as a software application. The application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate a finFET in which an electrical contact is attached to the backside of a bottom S/D in a vertical channel device, as described herein.

For the clarity of the description, and without implying any limitation thereto, the illustrative embodiments are described using a vertical channel finFET where a single vertical fin couples the bottom S/D and the top S/D. An embodiment can be implemented with a different number of gates, different number of fins, or both, within the scope of the illustrative embodiments. An embodiment can be implemented with other types of vertical channel devices, other types of contacts that have to be placed on the backside of a layer facing the substrate or another layer.

Furthermore, a simplified diagram of the example vertical finFET is used in the figures and the illustrative embodiments. In an actual fabrication of a vertical finFET, additional structures that are not shown or described herein, or structures different from those shown and described herein, may be present without departing the scope of the illustrative embodiments. Similarly, within the scope of the illustrative embodiments, a shown or described structure in the example finFET may be fabricated differently to yield a similar operation or result as described herein.

Differently shaded portions in the two-dimensional drawing of the example finFET are intended to represent different structures in the example finFET, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a finFET according to the illustrative embodiments.

Furthermore, the illustrative embodiments are described with respect to a finFET only as an example. The steps described by the various illustrative embodiments can be adapted for fabricating other planar and non-planar devices in a similar manner, and such adaptations are contemplated within the scope of the illustrative embodiments. The specific contacts placements are also used only as non-limiting examples to describe the various operations of the illustrative embodiments. Those of ordinary skill in the art will be able to use an embodiment to similarly provide access to the backside of a layer for other purposes in a similar manner, and such usage is also contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating vertical channel devices with accessibility to the backside of a bottom layer. A manner of accessing the backside of a bottom layer without exposure to the high temperature steps during the fabrication is unavailable in the presently available methods. Thus, a substantial advancement of such devices or data processing systems by executing a method of an embodiment is in an improved fabrication of vertical channel devices where the backside of a bottom layer becomes accessible after the gate formation, the resistance offered by the bottom layer is reduced, or both.

The illustrative embodiments are described with respect to certain types of devices, electrical properties, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
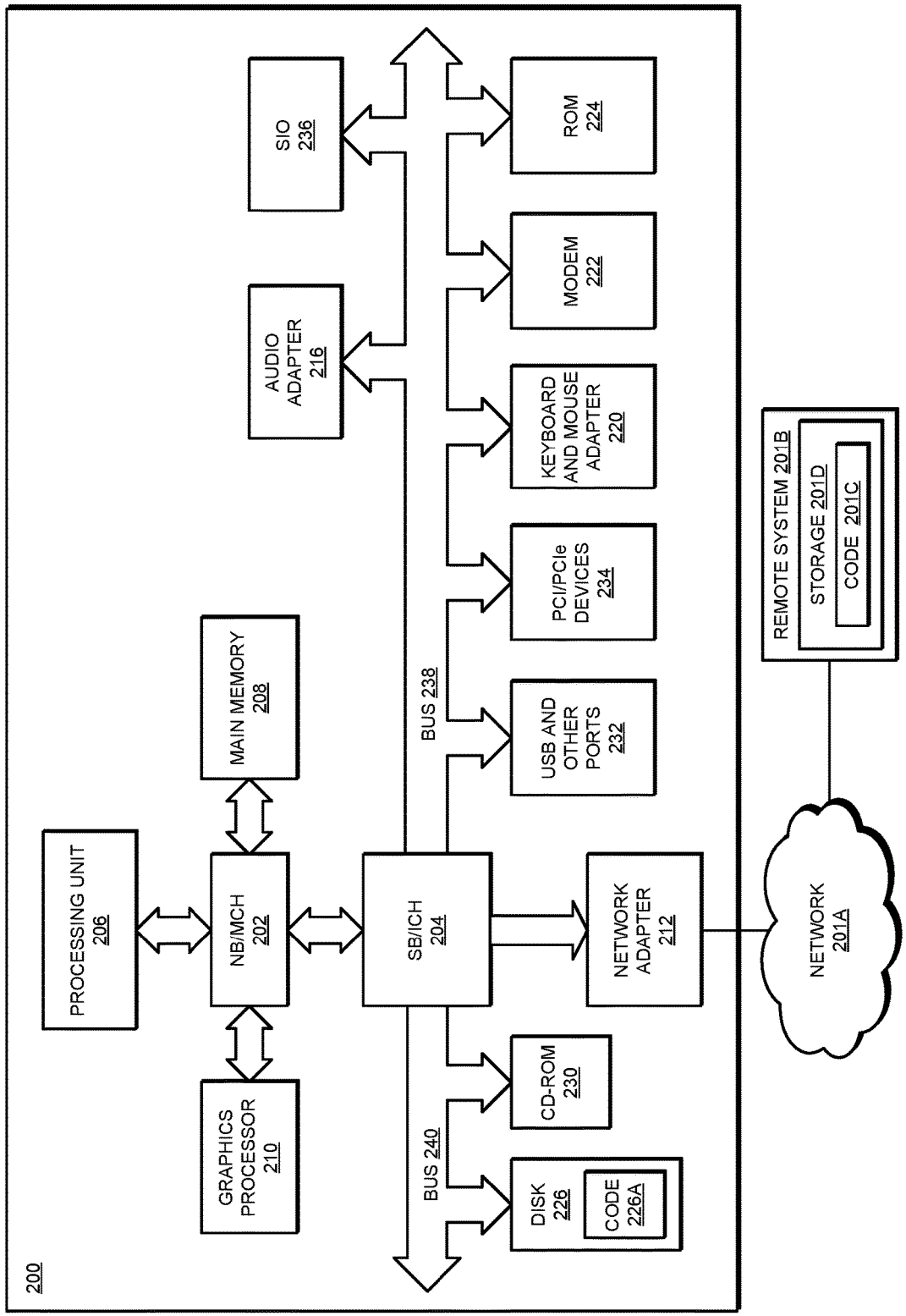
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a data processing device or a portable device usable for computing or communications purposes described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating a vertical channel semiconductor device where the backside of a bottom layer—such as the backside of a bottom S/D in a vertical finFET—is accessible for making electrical contact, where the accessibility mechanism for such backside access is unaffected by a high temperature step in the fabrication of the device, or a combination thereof, in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications.

Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other data processing devices, such as mobile device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different computer-components or data processing devices attached to the fabric or architecture.

A communications unit may include one or more communications-capable devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
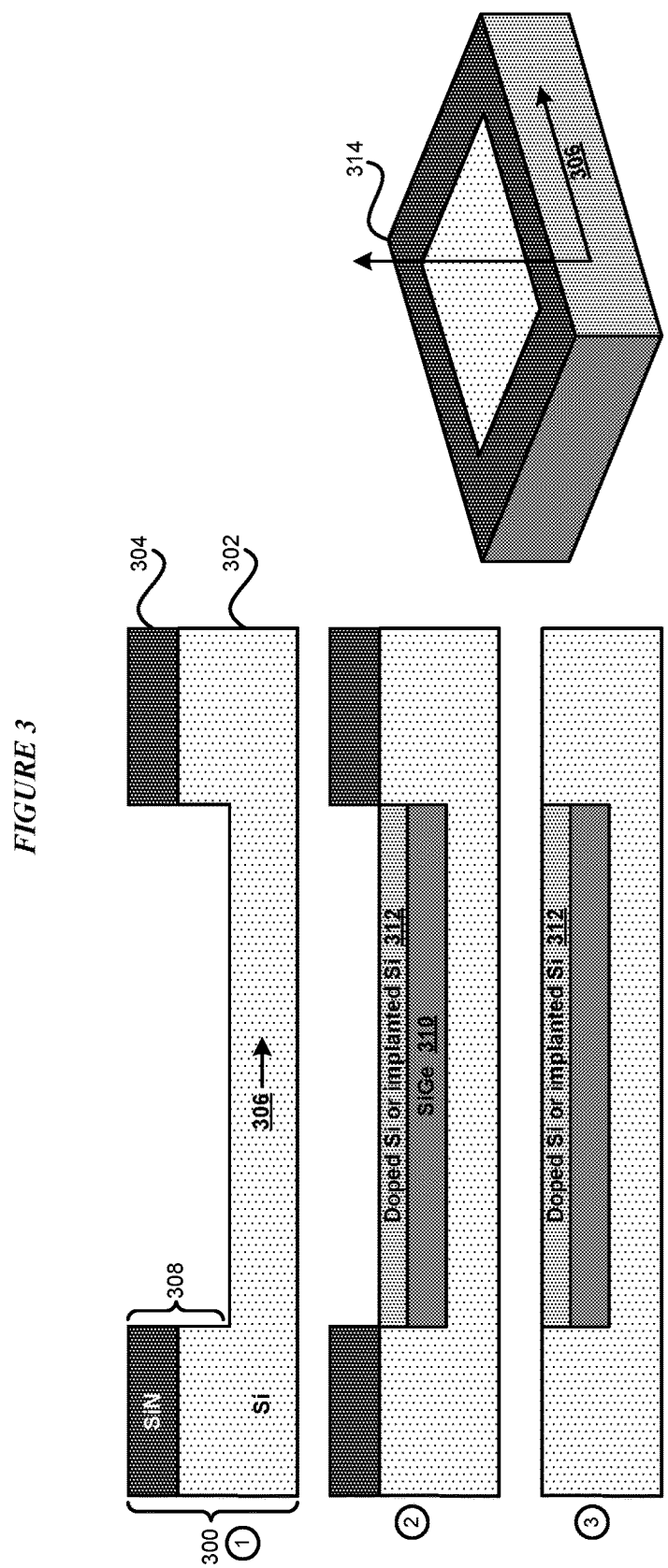
FIG. 3 depicts a block diagram of a portion of an example process for fabricating an example vertical channel finFET device in accordance with an illustrative embodiment.

With reference to FIG. 3, this figure depicts a block diagram of a portion of an example process for fabricating an example vertical channel finFET device in accordance with an illustrative embodiment. Application 105 in FIG. 1 interacts with fabrication system 107 to produce or manipulate substrate 300 as described herein.

Non-limiting example substrate 300 is depicted as comprising Silicon (Si) layer 302 and Silicon Nitride (SiN) layer 304. Direction 306 is a direction of the plane of fabrication, as described herein. In one step of the example process, notated as circled 1 without implying any sequencing of the steps, space 308 is created in substrate 300, e.g., by etching a portion of substrate 300.

In another step of the example process, notated as circled 2 without implying any sequencing of the steps, removable material layer 310 is formed in space 308. Removable material layer 310 is removable by any suitable method without disturbing adjacent structures. In one embodiment, removable material 310 is Silicon Germanium (SiGe) that is removable using hydrochloric acid (HCl) in a known process.

Further in the step of the example process, bottom layer 312, whose backside has to be accessible, is deposited over removable material 310. In one embodiment, bottom layer 312 is a bottom S/D of a vertical finFET device. In one embodiment, the material of bottom layer 312 comprises Dopes Si or implanted Si.

In another step of the example process, notated as circled 3 without implying any sequencing of the steps, layer 304 is removed. The removal can be accomplished using any known process, suitable for the material of layer 304 without disturbing layer 312.

Steps 1, 2, and 3 have been depicted in a cross-sectional view of the device being fabricated. View 314 is a three-dimensional view of the device being fabricated.

Figure 4:
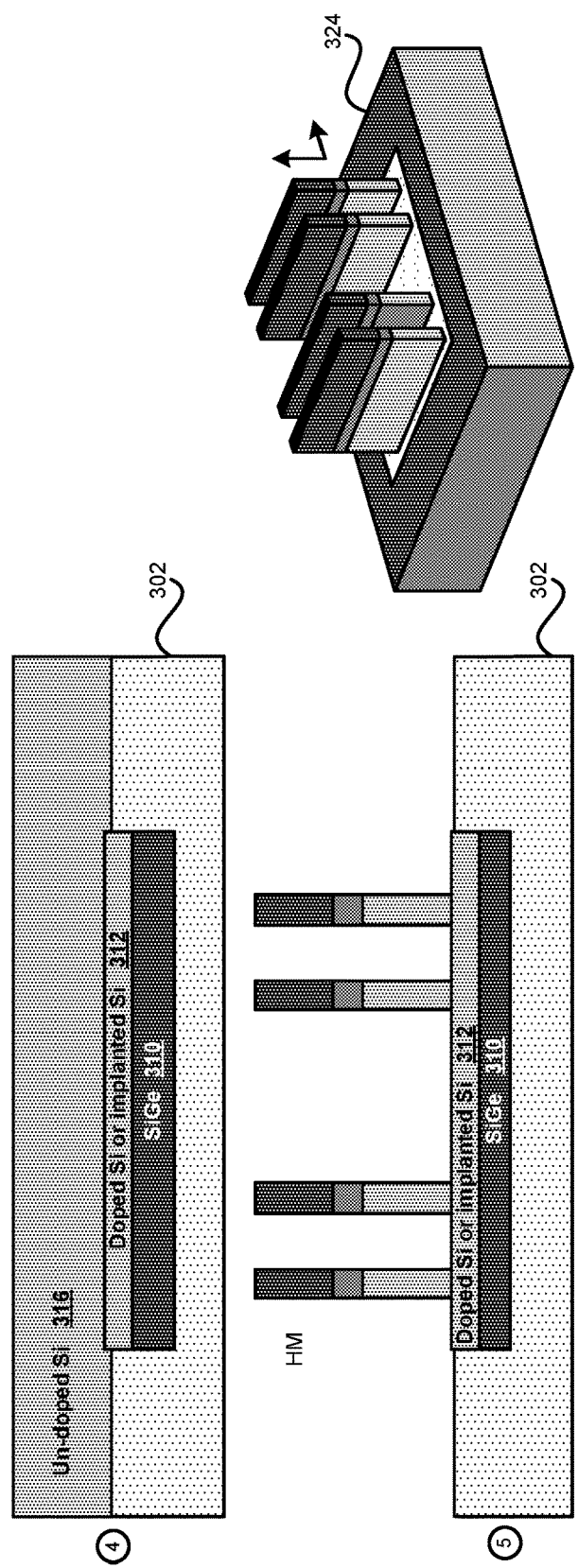
FIG. 4 depicts a block diagram of another portion of an example process for fabricating an example vertical channel finFET device in accordance with an illustrative embodiment.

With reference to FIG. 4, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

In another step of the example process, notated as circled 4 without implying any sequencing of the steps, a vertical channel material is deposited as layer 316 above layer 302. In one embodiment, the vertical channel material of layer 316 is un-doped Silicon.

In another step of the example process, notated as circled 5 without implying any sequencing of the steps, portions of layer 316 is removed such that vertical channel structure 318 is left standing in a direction substantially orthogonal to direction 306 of the plane of fabrication. Any number of vertical channel structures 318 can be fabricated in a similar manner. Four non-limiting example vertical channel structures 318 are shown, where the left two can be used in an example vertical n-finFET and the right two can be used in an example vertical p-finFET.

Hard mask (HM) 320 comprising one or more layers is deposited on top of vertical channel structures 318. In one embodiment, HM 320 is formed using SiN and separated from vertical channel structures 318 by a layer of Silicon Oxide (SiO). Generally, the SiO layer can be as thin as 2 nanometers.

Steps 4 and 5 have been depicted in a cross-sectional view of the device being fabricated. View 324 is a three-dimensional view of the device being fabricated.

Figure 5:
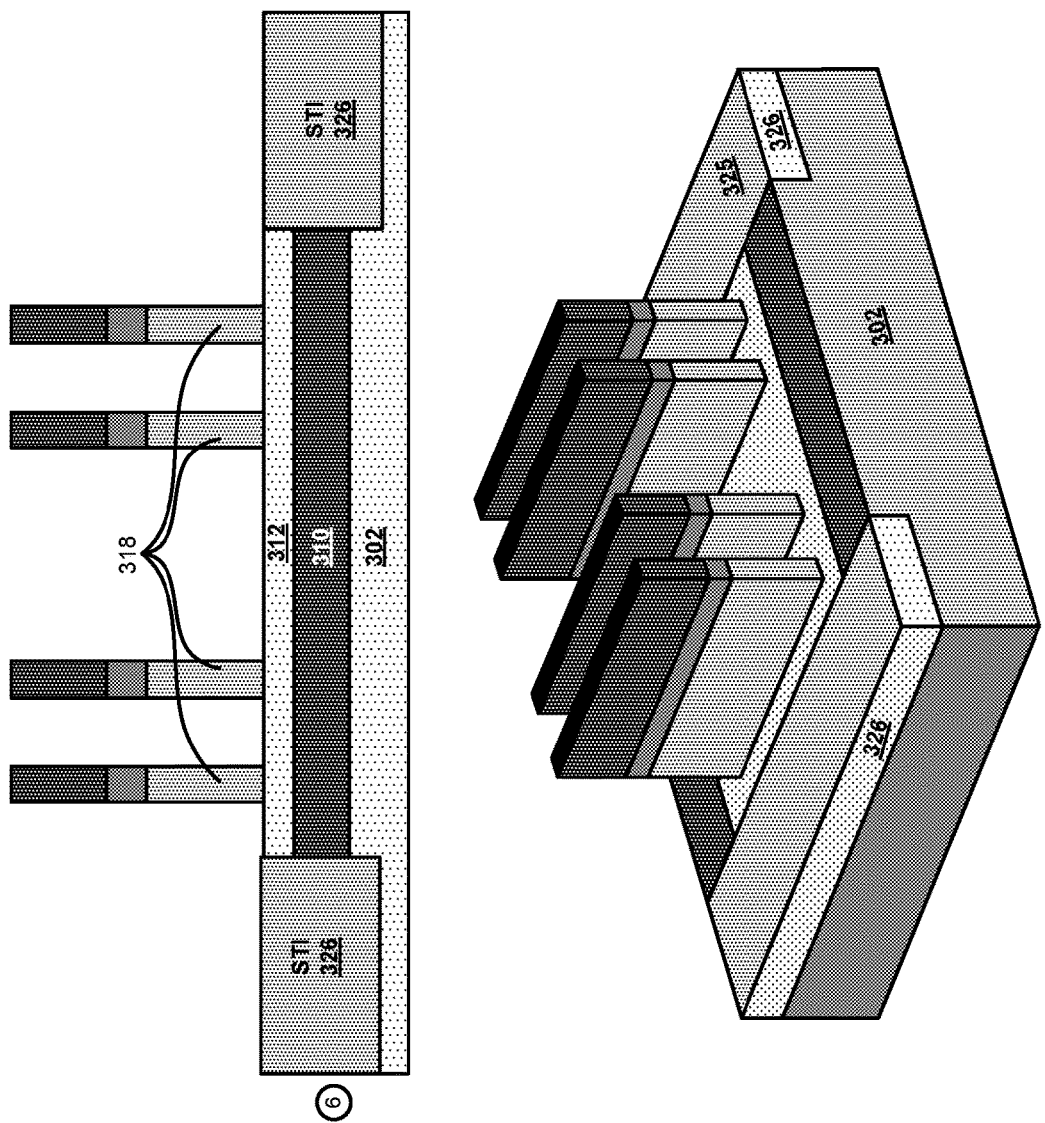
FIG. 5 depicts a block diagram of another portion of an example process for fabricating an example vertical channel finFET device in accordance with an illustrative embodiment.

With reference to FIG. 5, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

In another step of the example process, notated as circled 6 without implying any sequencing of the steps, shallow trench isolation (STI) structure 326 is formed using a suitable material. Only as an example, STI 326 is shown to be formed on each end of the structures being fabricated. Generally, STI 326 can be fabricated to separate different devices being fabricated on the same substrate.

Step 6 has been depicted in a cross-sectional view of the device being fabricated. View 325 is a three-dimensional view of the device being fabricated.

Figure 6:
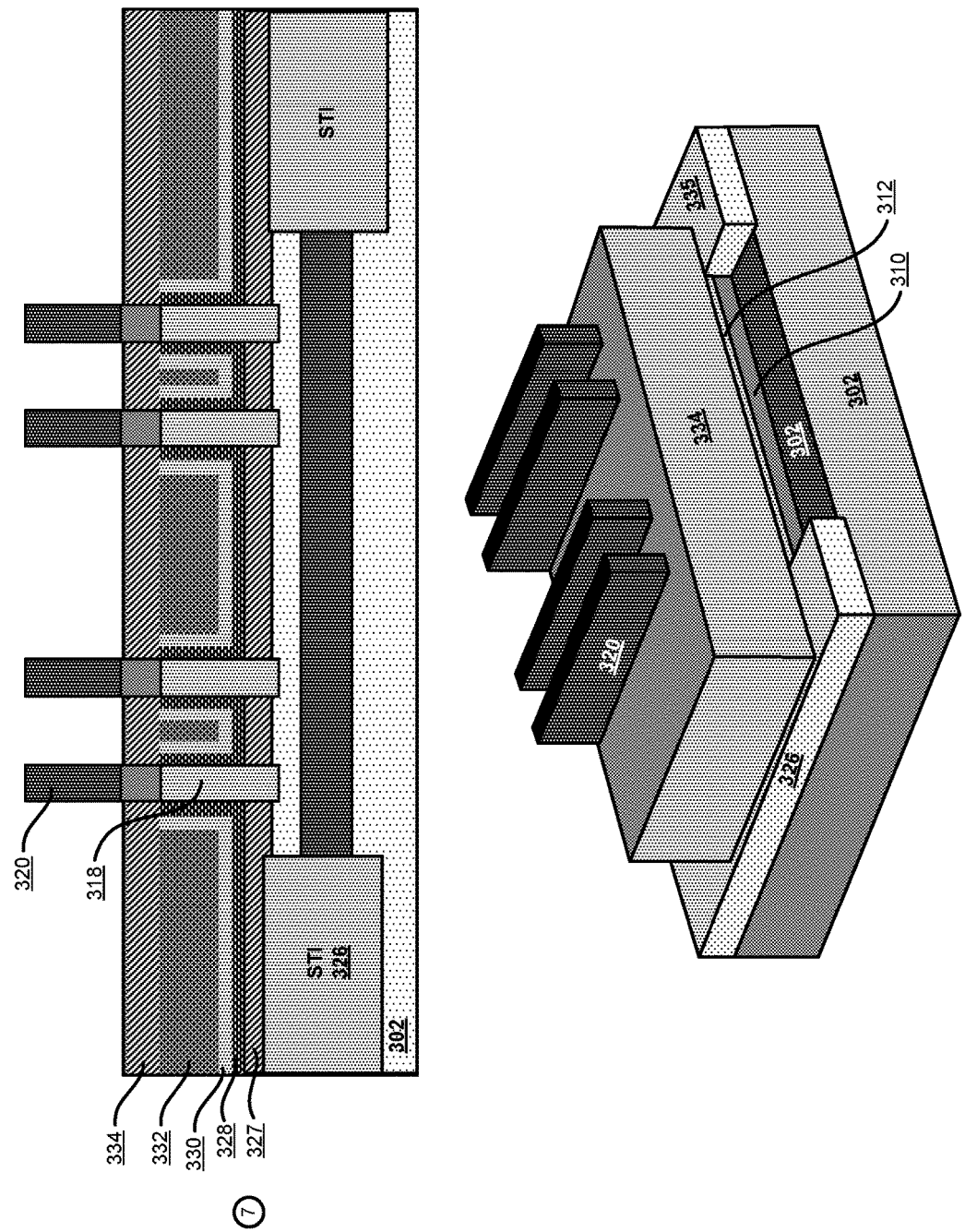
FIG. 6 depicts a block diagram of another portion of an example process for fabricating an example vertical channel finFET device in accordance with an illustrative embodiment.

With reference to FIG. 6, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

In another step of the example process, notated as circled 7 without implying any sequencing of the steps, additional layers or structures are formed as shown. For example, bottom spacer layer 327 is formed as shown using a suitable material. For example, in one embodiment, a metal oxide, nitride, or a similar material is used to form bottom spacer layer 327 as a dielectric film.

Further, a high resistance (high-k) material is used to form structure 328. Work function metal (WFM) layer 330 is formed as shown. Gates 332 are formed relative to a vertical channel structure 318 using a suitable metal as shown. For example, top spacer layer 334 is formed as shown using a suitable material. For example, in one embodiment, a metal oxide, nitride, or a similar material is used to form top spacer layer 334 as a dielectric film.

Step 7 has been depicted in a cross-sectional view of the device being fabricated. View 335 is a three-dimensional view of the device being fabricated. Furthermore, removable material layer 310 is caused to be exposed. For example, material obstructing access to layer 310 is etched using a suitable method to expose at least one side of layer 310 as is more clearly visible in three-dimensional view 335.

Figure 7:
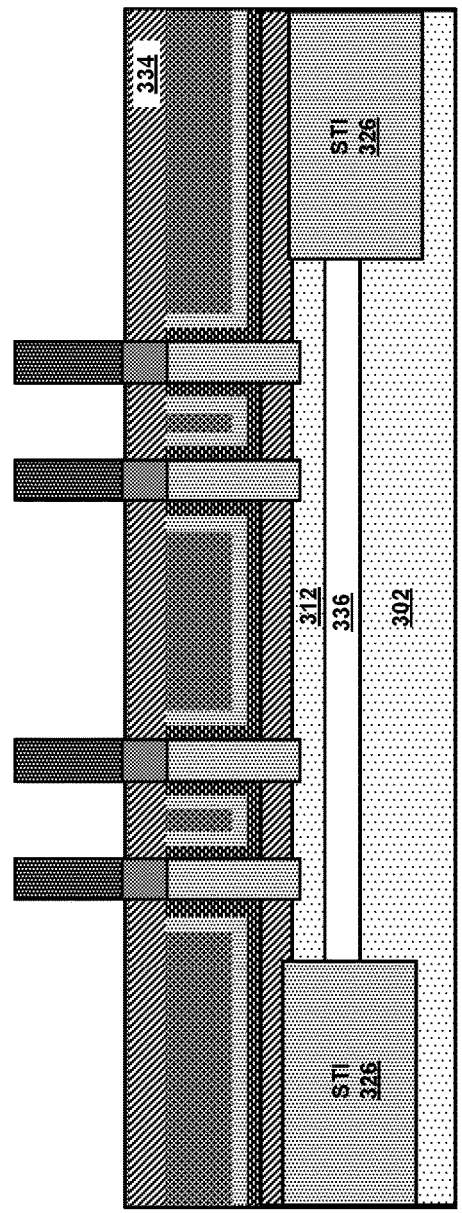
FIG. 7 depicts a block diagram of another portion of an example process for fabricating an example vertical channel finFET device in accordance with an illustrative embodiment.
Figure 7:
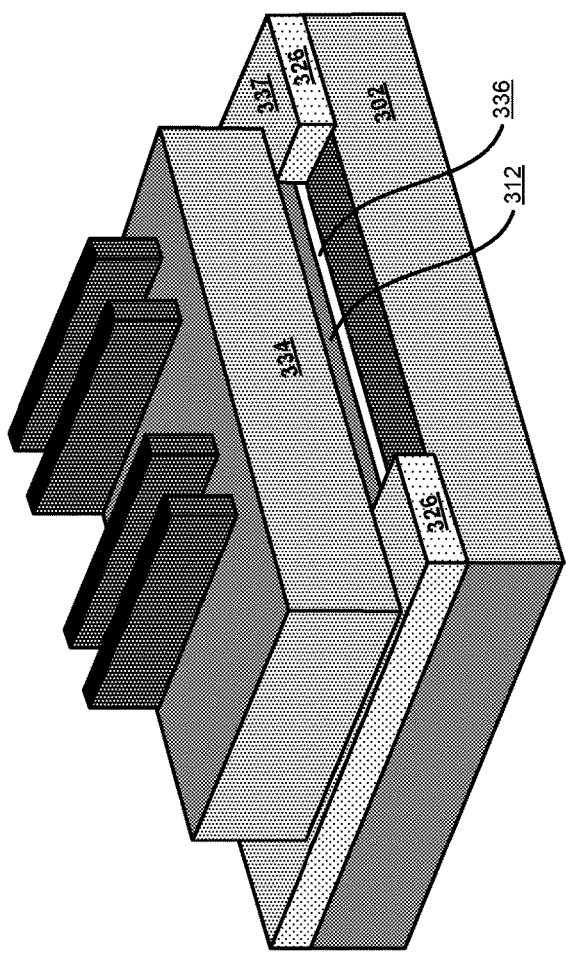

With reference to FIG. 7, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

Note that the high temperature step of forming gates 332 has now been completed in the step 7 or sub-steps thereof, as depicted in FIG. 6. In step 8, which occurs after step 7 has already occurred immediately prior to step 8 or with some other steps intervening, removable material layer 310 is now removed to form tunnel 336 below bottom layer 312. Tunnel 336 is a hollow space, or void, below bottom layer 312, formed such that the backside of bottom layer 312 forms the ceiling of tunnel 336.

Step 8 has been depicted in a cross-sectional view of the device being fabricated. View 337 is a three-dimensional view of the device being fabricated.

Figure 8A:
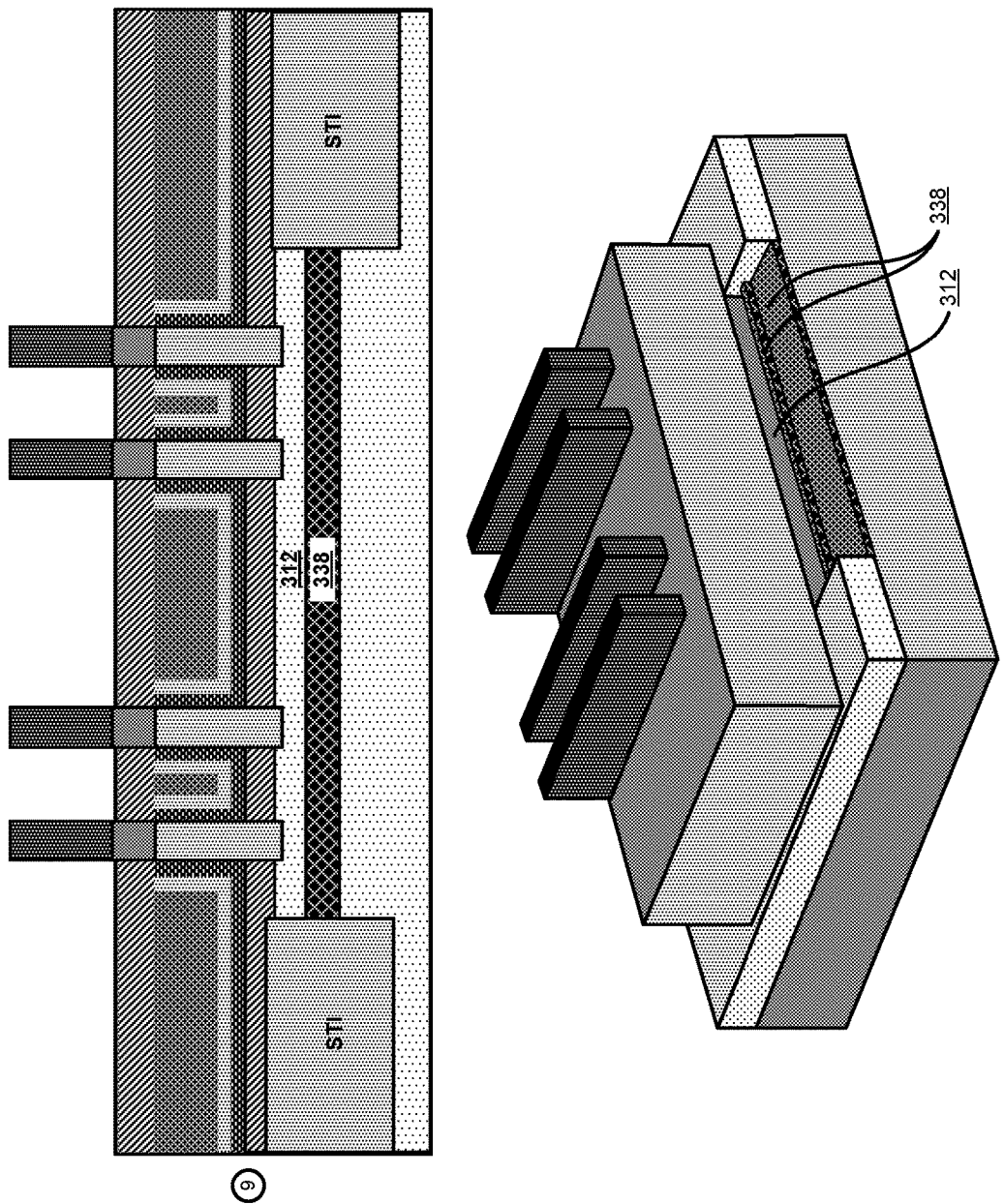
FIG. 8A depicts a block diagram of another portion of an example process for fabricating an example vertical channel finFET device in accordance with an illustrative embodiment.

With reference to FIG. 8A, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

In another step of the example process, notated as circled 9, additional structures are formed as shown. In step 9, which occurs after step 8 has already occurred immediately prior to step 9 or with some other steps intervening, tunnel 336 is filled with conductive material 338. In one embodiment, conductive material 338 is a Silicide of a suitable metal, such as, but not limited to Titanium Silicide, Cobalt Silicide, and many others.

Step 9 has been depicted in a cross-sectional view of the device being fabricated. View 339A is a three-dimensional view of the device being fabricated.

Figure 8B:
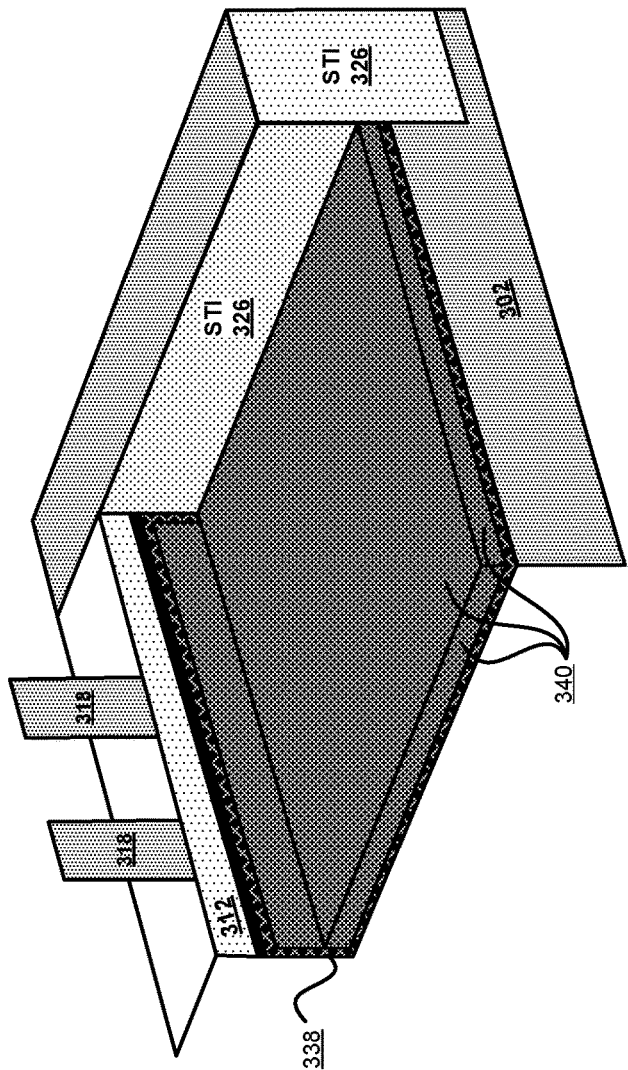
FIG. 8B depicts another three-dimensional view of the filled tunnel in accordance with an illustrative embodiment.

Not shown in FIG. 8A, but shown in FIG. 8B, is one non-limiting example manner of filling tunnel 336 with material 338. In this example, material 338 is a silicide. Filling silicide 338 in tunnel 336 is performed by first coating tunnel 336—by first depositing a metal such as Titanium (Ti), Cobalt (Co), Nickel (Ni), Nickel Platinum alloy, or Tungsten (W), using a process such as Chemical Vapor Deposition (CVD) or atomic layer deposition (ALD)—such that the metal occupies only a portion of the tunnel space, leaving tunnel 336 still open through the length of tunnel 336 and open at both ends.

For example, if the tunnel were 15 nanometers tall and 15 nanometers wide, and L nanometers long, the metal would be deposited such that 3-4 nanometers thick layer of the metal would deposit on each wall of tunnel 336, leaving 8-7 nanometers of width and height still open for length L of tunnel 336. The remaining open space of 8-7 nanometers wide and tall is then filled with a suitable silicide.

The silicide may be, but need not be filled for the entire length L, for the entire remaining width of the remaining opening of tunnel 336, for the entire remaining height of the remaining opening of tunnel 336, or some combination thereof. The silicide filling may be filled in the remaining opening of tunnel 336 at least to the extent that the silicide is electrically connected with the backside of bottom layer 312, and is sufficiently exposed and accessible to connect a contact to the silicide.

With reference to FIG. 8B, this figure depicts another three-dimensional view of the filled tunnel in accordance with an illustrative embodiment. View 339B is another three-dimensional view of step 9 with the metal coating depicted.

Coating 340 is the metal deposited using CVD or other suitable technique. Metal 340 makes electrical contact with the backside of bottom layer 312, as shown. Filled silicide 338 makes electrical contact with metal 340, thereby making an electrical connection with the backside of bottom layer 312, as shown. Fully filled tunnel 336 is shown in FIG. 8B without implying any limitation. Partially filled tunnel 336—partially coated with metal 340, partially filled with conducting material 338, or both, can also be used, as described herein.

Figure 9:
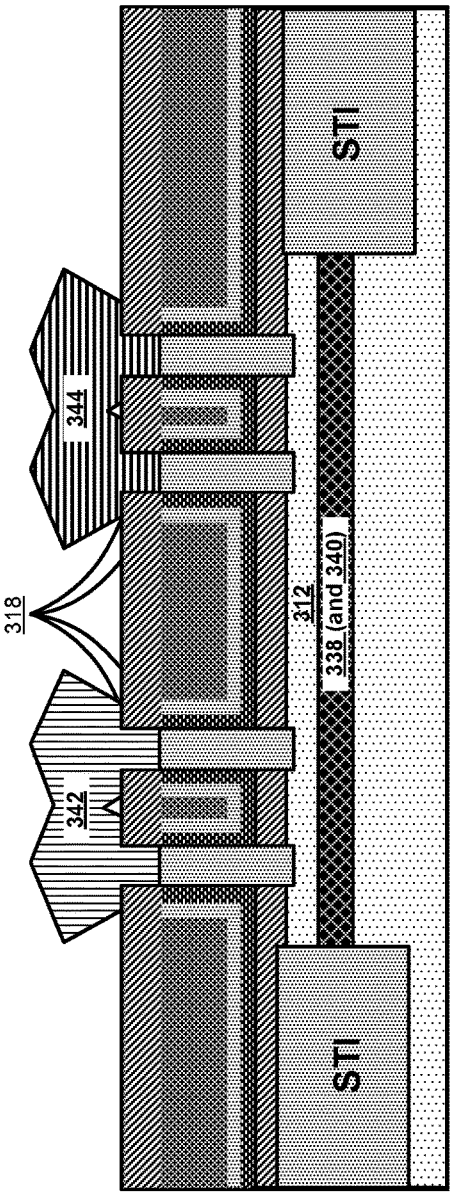
FIG. 9 depicts a block diagram of another portion of an example process for fabricating an example vertical channel finFET device in accordance with an illustrative embodiment.
Figure 9:
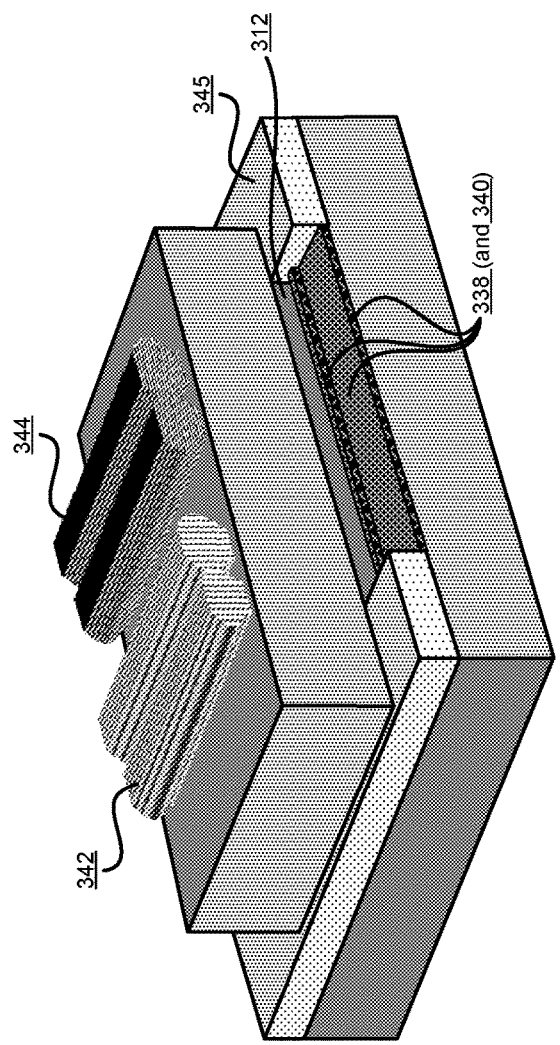

With reference to FIG. 9, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

In another step of the example process, notated as circled 10 without implying any sequencing of the steps, additional layers or structures are formed as shown. Top S/D 342 is formed over a vertical channel, e.g., over one or more vertical channels 318. Particularly, HM 320 and any intermediate layers such as layer 322 are removed from each such vertical channel 318 over which top S/D 342 is formed, such that top S/D 342 can be electrically connected with the one or more vertical channel 318.

Multiple top S/D can be similarly formed using different sets of vertical channels 318—e.g., top S/D 342 formed using two vertical channel 318 and top S/D 344 formed using two different vertical channel 318. In one embodiment, an epitaxy (epi) is formed for use as top S/D 342 and a different epi is formed for use as top S/D 344.

The materials used for top S/D 342 and 344 may be same or different depending on the devices being fabricated for example top S/D 342 could be the top S/D for an n-finFET and top S/D 344 could be the top S/D for a p-finFET.

Step 10 has been depicted in a cross-sectional view of the device being fabricated. View 345 is a three-dimensional view of the device being fabricated.

Figure 10:
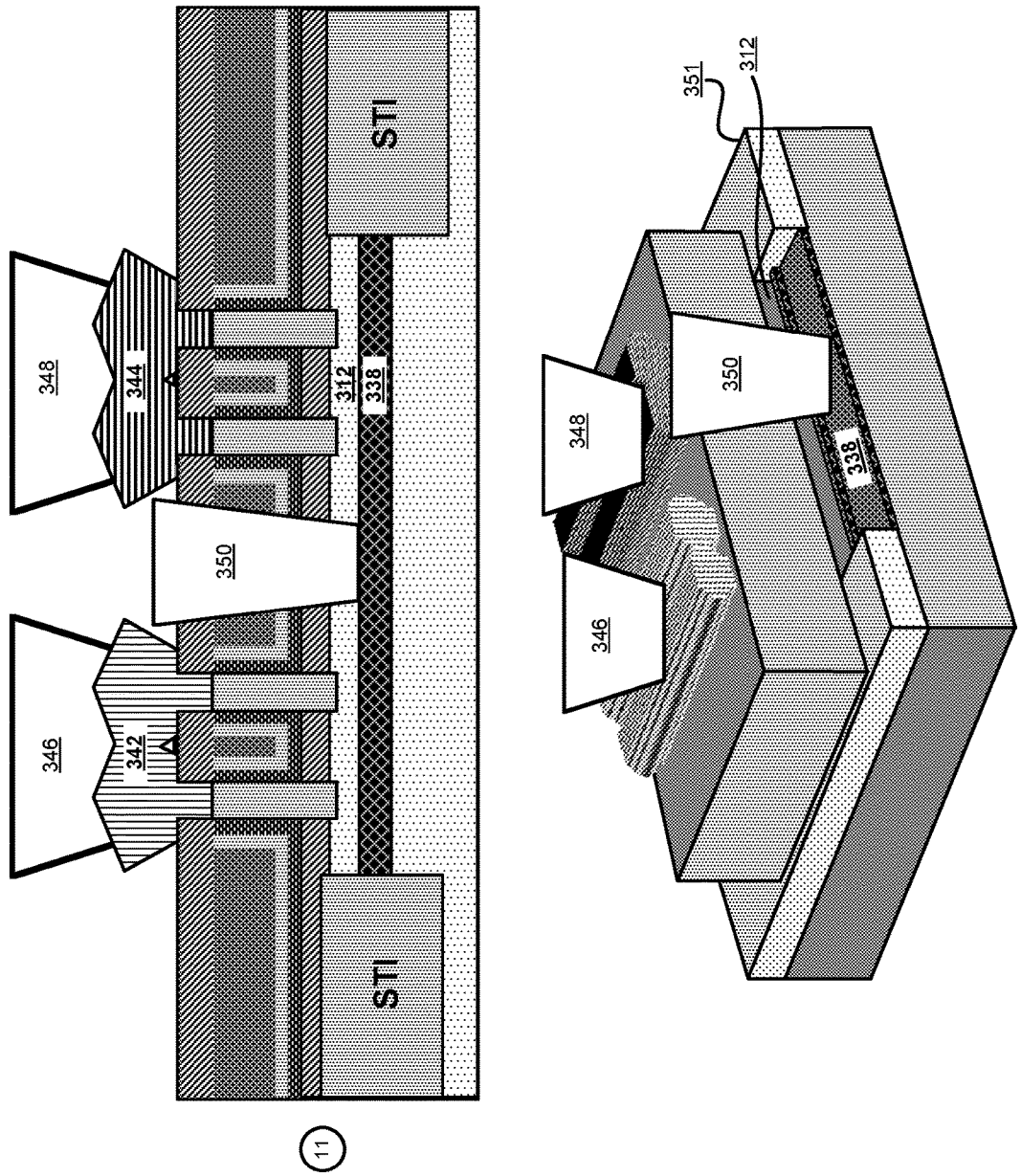
FIG. 10 depicts a block diagram of another portion of an example process for fabricating an example vertical channel finFET device in accordance with an illustrative embodiment.

With reference to FIG. 10, this figure depicts a block diagram of another portion of an example process for fabricating an example vertical channel finFET device in accordance with an illustrative embodiment. Application 105 in FIG. 1 interacts with fabrication system 107 to produce or manipulate substrate 300 as described herein.

In another step of the example process, notated as circled 11, additional layers or structures are formed as shown. Contact 346 is electrically coupled with top S/D 342. Contact 346 is formed using a suitably conductive material. Similarly, contact 348 is formed and electrically coupled with top S/D 344. Contact 350 is formed and electrically coupled with an exposed and accessible portion of silicide or other similarly purposed material 338, which is electrically coupled with the backside of bottom layer 312 as described herein.

Step 11 has been depicted in a cross-sectional view of the device being fabricated. View 351 is a three-dimensional view of the device being fabricated.

Figure 11:
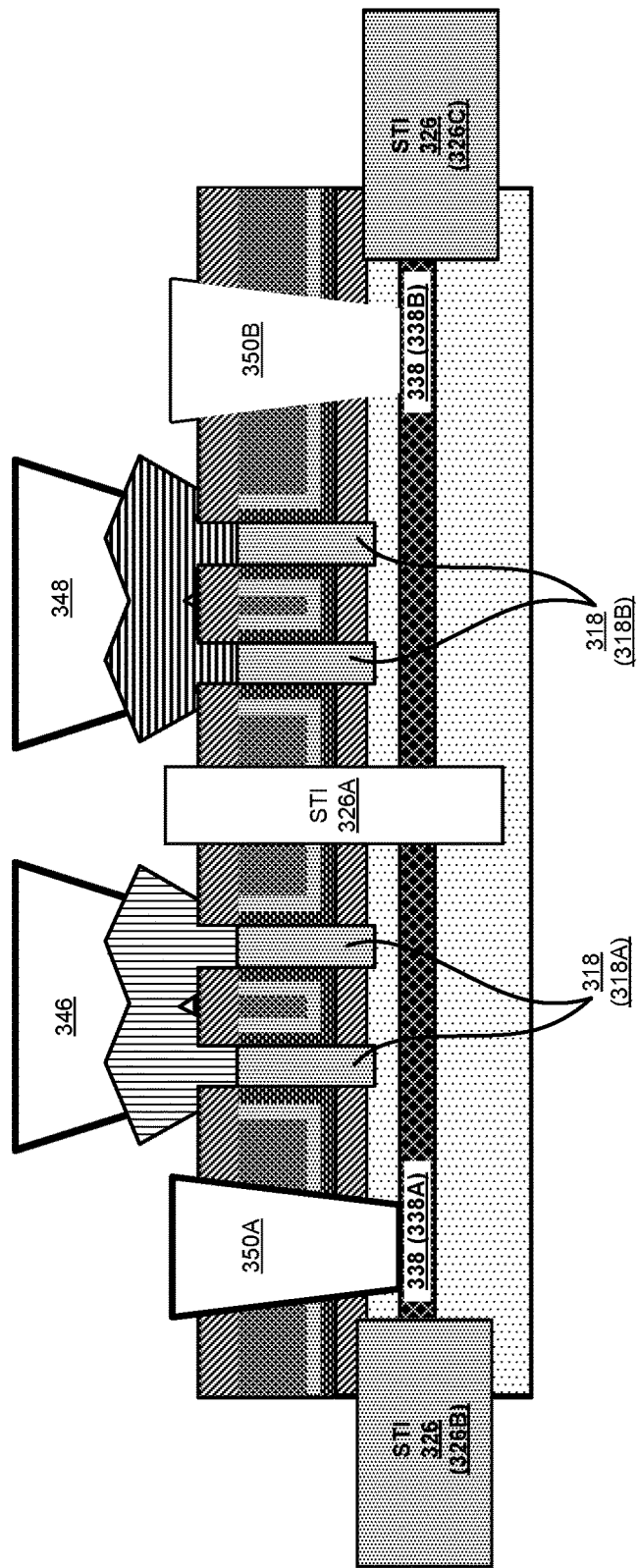
FIG. 11 depicts a block diagram of an example process for fabricating multiple vertical channel devices with reduced bottom S/D resistance in accordance with an illustrative embodiment.

With reference to FIG. 11, this figure depicts a block diagram of an example process for fabricating multiple vertical channel devices with reduced bottom S/D resistance in accordance with an illustrative embodiment. Application 105 in FIG. 1 interacts with fabrication system 107 to produce or manipulate substrate 300 as described herein.

The structures formed using an embodiment and depicted in FIG. 10, can be formed into separate devices, e.g., an n-finFET and a p-finFET, as shown in FIG. 11. For example, STI 326 can be formed using a suitable method between vertical channels 318A and 318B, and extending through each layer starting at top spacer 334 and all the way into layer 302, extending all the way to the back for the entire length of the devices, as shown in this length-wise view 351B (if view 351B is assumed to be in the XY coordinate plane, the length of the devices is the Z axis).

STI 326A fully isolates the example n-finFET device (bound between STI 326A and 326B) from the example p-finFET device (bound between STI 326A and 326C). Contact 346 becomes the top S/D contact for the n-finFET device and connects to vertical channels 318A. Contact 350A is placed in electrical connection with silicide or other similarly purposed material filling 338A. Contact 348 becomes the top S/D contact for the p-finFET device and connects to vertical channels 318B. Contact 350B is placed in electrical connection with silicide or other similarly purposed material filling 338B.

Figure 12:
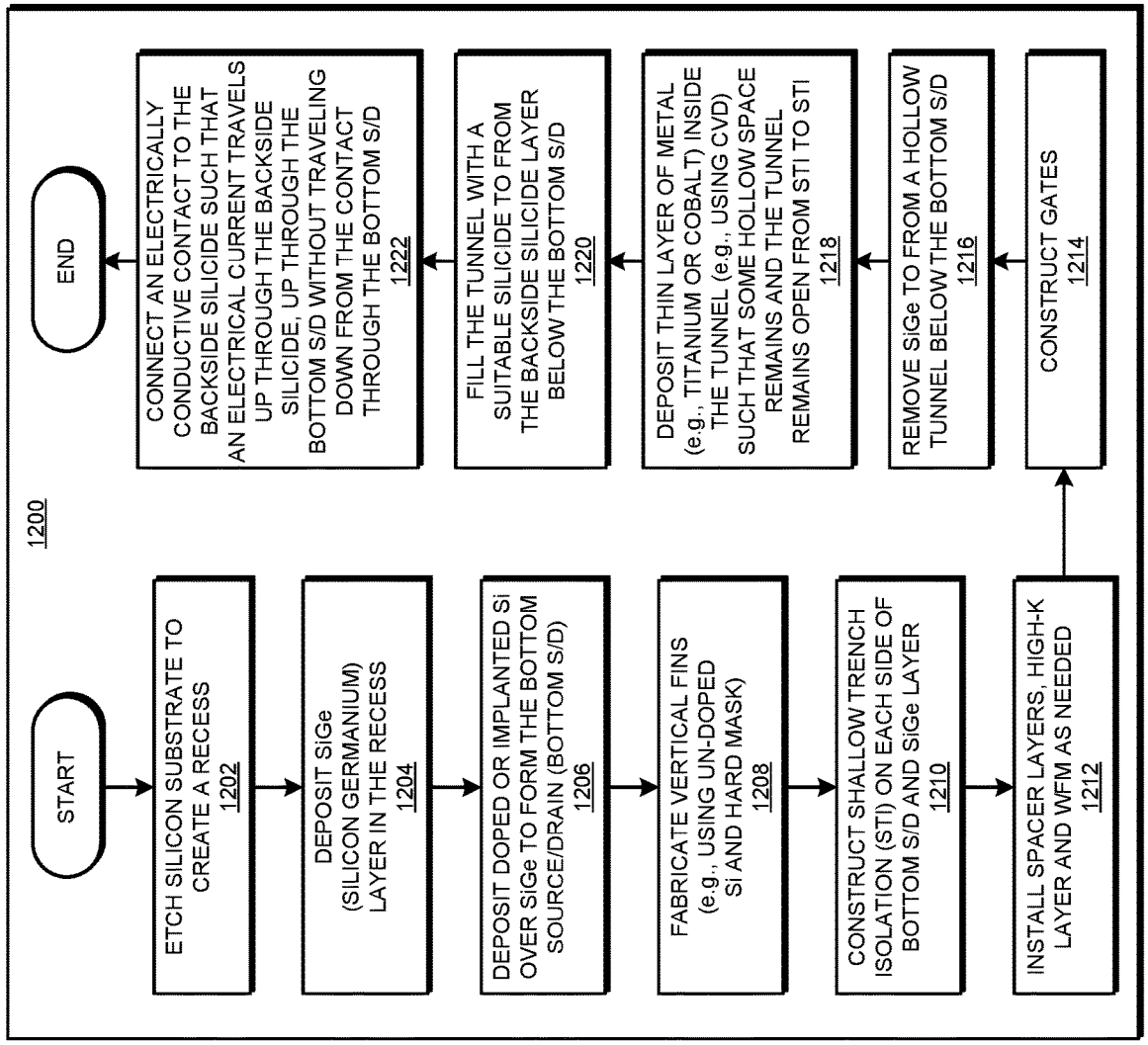
FIG. 12 depicts a flowchart of an example process for reducing resistance of bottom source/drain in vertical channel devices in accordance with an illustrative embodiment.

With reference to FIG. 12, this figure depicts a flowchart of an example process for reducing resistance of bottom source/drain in vertical channel devices in accordance with an illustrative embodiment. Process 1200 can be implemented in application 105 in FIG. 1.

The application etches a substrate to create a recess (block 1202). The application deposits or forms a layer of SiGe or other removable material in the recess (block 1204). The application deposits or forms a bottom S/D layer over the SiGe layer of block 1204 using a suitable material such as doped or implanted Si (block 1206).

The application fabricates one or more vertical channels (e.g., vertical fins) using a suitable material such as un-doped Si, a hard mask of a suitable material over the fins and any intermediate layers between the top of the fin and the bottom of the hard mask (block 1208). The application constructs STI structures on each side of the bottom S/D layer and the SiGe layer (block 1210).

The application optionally installs spacer layers, high-k layer, and WFM layer, or some combination thereof, as needed for the device being fabricated (block 1212). The application constructs one or more gates using a suitable metal (block 1214).

The application removes the SiGe layer to form a hollow tunnel below the bottom S/D, exposing the backside of the bottom S/D layer (block 1216). The application optionally deposits a thin layer of a suitable metal inside the tunnel on the tunnel walls, floor, and ceiling using a suitable method (block 1218). The depositing of the metal still keeps the tunnel open from STI to STI.

The application fills the remaining opening in the tunnel, fully or partially as described herein, with a suitable silicide or an equivalent material such that the silicide makes electrical contact with the backside of the bottom S/D (block 1220). A removal of some material may be needed to expose at least an STI-side end of the SiGe layer, so that the removal of the SiGe layer, the depositing of the metal in the tunnel, and the filling of the silicide in the tunnel can be performed. The filling is performed in a manner that at least a portion of the silicide remains exposed and accessible for electrical connection.

The application connects an electrically conductive contact to the silicide (block 1222). The application ends process 1200 thereafter. This manner of connecting the electrical contact to the silicide causes an electrical current to advantageously travel from the contact through low-resistance silicide and up through the bottom S/D to the vertical channel (or a reverse of this flow depending on the operation of the device) according to the illustrative embodiments, without having to first travel down and across the bottom S/D before traveling up through the bottom S/D and to the vertical channel (or a reverse of this flow) as in the prior-art.

Thus, a computer implemented method, system or apparatus, and computer program product are provided in the illustrative embodiments for reducing resistance of bottom source/drain in vertical channel devices and other related features, functions, or operations. Where an embodiment or a portion thereof is described with respect to a type of mobile device, the computer implemented method, system or apparatus, the computer program product, or a portion thereof, are adapted or configured for use with a suitable and comparable manifestation of that type of mobile device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer usable program product comprising one or more computer-readable storage devices, and program instructions stored on at least one of the one or more storage devices, the stored program instructions comprising:
program instructions to create, during a fabrication of a semiconductor device, in a substrate material disposed along a direction of a plane of fabrication, a recess;
program instructions to form, in the recess, a layer of a removable material;
program instructions to form, above the layer of removable material, a bottom layer, wherein a backside of the bottom layer is a side of the bottom layer that faces the layer of removable material;
program instructions to form, in a direction substantially orthogonal to the direction of the plane of fabrication, a vertical channel above the bottom layer;
program instructions to form, above the bottom layer and relative to the vertical channel, a gate using a metal;
program instructions to create a tunnel under the bottom layer by removing the removable material from under the bottom layer such that the backside of the bottom layer forms a ceiling of the tunnel;
program instructions to fill the tunnel using a conductive material such that the conductive material makes electrical contact with the backside of the bottom layer; and program instructions to electrically connect a contact with the conductive material filled in the tunnel to form an electrical connection with the backside of the bottom layer.

2. The computer usable program product of claim 1, further comprising:
program instructions to deposit, without obstructing the tunnel, a metal on inside surfaces of the tunnel, the depositing shrinking an opening of the tunnel but leaving the tunnel open end-to-end, and wherein the filling occurs after the depositing of the metal on the inside surfaces of the tunnel such that the conductive material being filled makes electrical contact with the deposited metal at least on the ceiling of the tunnel.

3. The computer usable program product of claim 1, wherein the conductive material is a silicide of a metal.

4. The computer usable program product of claim 3, wherein the metal is one of Titanium, Cobalt, Nickel, Nickel Platinum alloy, and Tungsten.

5. The computer usable program product of claim 1, wherein the program instructions to create the tunnel executes after the program instructions to form the gate, wherein the program instructions to form the gate employs a temperature that is destructive to a second contact when the second contact is placed on the bottom layer prior to the forming the gate.

6. The computer usable program product of claim 1, further comprising:
program instructions to form a first shallow trench isolation (STI) structure on one side of the bottom layer and the layer of the removable material;
program instructions to form a second STI structure on an opposite side of the bottom layer and the layer of the removable material; and
program instructions to expose a third side of the layer of removable material for the creating the tunnel.

7. The computer usable program product of claim 1, further comprising:
program instructions to form a hard mask on top of the vertical channel; forming at least one spacer layer;
program instructions to form at least one high resistance (high-k) layer; and
program instructions to form at least one work function metal (WFM) layer.

8. The computer usable program product of claim 1, further comprising:
program instructions to form above the vertical channel a top source/drain (S/D), wherein the bottom layer is a bottom S/D, and wherein an electrical current flows between the top S/D and the bottom S/D through the vertical channel in the direction substantially orthogonal to the direction of the plane of fabrication.

9. The computer usable program product of claim 1, wherein the removable material is Silicon Germanium (Site).

10. The computer usable program product of claim 1, wherein the vertical channel device is a vertical fin Field Effect Transistor (vertical finFET).

11. The computer usable program product of claim 1, wherein the computer usable code is stored in a computer readable storage device in a data processing system, and wherein the computer usable code is transferred over a network from a remote data processing system.

12. The computer usable program product of claim 1, wherein the computer usable code is stored in a computer readable storage device in a server data processing system, and wherein the computer usable code is downloaded over a network to a remote data processing system for use in a computer readable storage device associated with the remote data processing system.

13. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:
program instructions to create, during a fabrication of a semiconductor device, in a substrate material disposed along a direction of a plane of fabrication, a recess;
program instructions to form, in the recess, a layer of a removable material;
program instructions to form, above the layer of removable material, a bottom layer, wherein a backside of the bottom layer is a side of the bottom layer that faces the layer of removable material;
program instructions to form, in a direction substantially orthogonal to the direction of the plane of fabrication, a vertical channel above the bottom layer;
program instructions to form, above the bottom layer and relative to the vertical channel, a gate using a metal;
program instructions to create a tunnel under the bottom layer by removing the removable material from under the bottom layer such that the backside of the bottom layer forms a ceiling of the tunnel;
program instructions to fill the tunnel using a conductive material such that the conductive material makes electrical contact with the backside of the bottom layer; and
program instructions to electrically connect a contact with the conductive material filled in the tunnel to form an electrical connection with the backside of the bottom layer.

14. The computer system of claim 13, further comprising:
program instructions to deposit, without obstructing the tunnel, a metal on inside surfaces of the tunnel, the depositing shrinking an opening of the tunnel but leaving the tunnel open end-to-end, and wherein the filling occurs after the depositing of the metal on the inside surfaces of the tunnel such that the conductive material being filled makes electrical contact with the deposited metal at least on the ceiling of the tunnel.

15. The computer system of claim 13, wherein the conductive material is a silicide of a metal.

16. The computer system of claim 15, wherein the metal is one of Titanium, Cobalt, Nickel, Nickel Platinum alloy, and Tungsten.

17. The computer system of claim 13, wherein the program instructions to create the tunnel executes after the program instructions to form the gate, wherein the program instructions to form the gate employs a temperature that is destructive to a second contact when the second contact is placed on the bottom layer prior to the forming the gate.

18. The computer system of claim 13, further comprising:
program instructions to form a first shallow trench isolation (STI) structure on one side of the bottom layer and the layer of the removable material;
program instructions to form a second STI structure on an opposite side of the bottom layer and the layer of the removable material; and
program instructions to expose a third side of the layer of removable material for the creating the tunnel.

19. The computer system of claim 13, further comprising:
program instructions to form a hard mask on top of the vertical channel; forming at least one spacer layer;
program instructions to form at least one high resistance (high-k) layer; and
program instructions to form at least one work function metal (WFM) layer.

20. The computer system of claim 13, further comprising:
program instructions to form above the vertical channel a top source/drain (S/D), wherein the bottom layer is a bottom S/D, and wherein an electrical current flows between the top S/D and the bottom S/D through the vertical channel in the direction substantially orthogonal to the direction of the plane of fabrication.

\* \* \* \* \*